United States Patent
Okamoto et al.

(10) Patent No.: US 8,492,909 B2
(45) Date of Patent: Jul. 23, 2013

(54) INSULATING MEMBER, METAL BASE SUBSTRATE, AND SEMICONDUCTOR MODULE, AND MANUFACTURING METHODS THEREOF

(75) Inventors: Kenji Okamoto, Hachioji (JP); Tatsuya Ganbe, Asaka (JP)

(73) Assignee: Fuji Electric Co., Ltd. (JP)

( * ) Notice: Subject to any disclaimer, the term of this patent is extended or adjusted under 35 U.S.C. 154(b) by 160 days.

(21) Appl. No.: 13/162,239

(22) Filed: Jun. 16, 2011

(65) Prior Publication Data
US 2011/0309527 A1    Dec. 22, 2011

(30) Foreign Application Priority Data
Jun. 17, 2010   (JP) ................................ 2010-138136

(51) Int. Cl.
*H01L 23/29* (2006.01)
(52) U.S. Cl.
USPC ............. 257/795; 257/E23.121; 257/789; 257/793; 438/124; 438/126; 438/127; 428/323; 428/324
(58) Field of Classification Search
CPC .......... H01L 23/00; H01L 21/50; B32B 5/16
USPC .............. 257/E21.499, E23.001, E23.107, 257/E23.121, 782, 789, 793, 795; 438/106, 438/124–127, 323; 428/209, 323, 324, 363, 428/375
See application file for complete search history.

(56) References Cited

U.S. PATENT DOCUMENTS

| | | | | |
|---|---|---|---|---|
| 4,975,314 A | * | 12/1990 | Yano et al. | 428/213 |
| 5,391,924 A | * | 2/1995 | Uchida et al. | 257/789 |
| 5,527,604 A | * | 6/1996 | Hayashi | 428/323 |
| 5,578,365 A | * | 11/1996 | Kume et al. | 428/195.1 |
| 5,629,566 A | * | 5/1997 | Doi et al. | 257/789 |
| 5,703,399 A | | 12/1997 | Majumdar et al. | |
| 6,783,828 B2 | * | 8/2004 | Fujimaru et al. | 428/40.1 |
| 7,216,711 B2 | * | 5/2007 | Nguyen et al. | 166/308.1 |
| 7,501,660 B2 | * | 3/2009 | Schmid et al. | 257/81 |
| 7,608,372 B2 | * | 10/2009 | Ishida et al. | 430/66 |

(Continued)

FOREIGN PATENT DOCUMENTS

| | | |
|---|---|---|
| JP | 09-139461 A | 5/1997 |
| JP | 2006-249276 A | 9/2006 |
| JP | 2007-077333 A | 3/2007 |

OTHER PUBLICATIONS

JP OA issued Oct. 10, 2012 for corresponding JP 2010-138136 (Partial English translation provided).

*Primary Examiner* — Chris Chu
(74) *Attorney, Agent, or Firm* — Rossi, Kimms & McDowell LLP

(57) ABSTRACT

An insulating member of the invention can include an epoxy resin, a first inorganic filler diffused in the epoxy resin and having an average particle diameter of 1 to 99 nm, and a second inorganic filler diffused in the epoxy resin and having an average particle diameter of 0.1 to 100 μm. The first and second inorganic fillers can be independent of each other, and can be selected from a group including $Al_2O_3$, $SiO_2$, BN, AlN, and $Si_3N_4$, and the blending ratios of the first and second inorganic fillers in the insulating member can be 0.1 to 7% by weight and 80 to 95% by weight respectively. A metal base substrate can be formed by forming a metal foil and a metal base on either surface of the insulating member.

12 Claims, 4 Drawing Sheets

U.S. PATENT DOCUMENTS

| | | | |
|---|---|---|---|
| 7,795,797 B2 * | 9/2010 | Kondo et al. | 313/503 |
| 7,830,026 B2 * | 11/2010 | Beer et al. | 257/789 |
| 7,952,212 B2 * | 5/2011 | Chakrapani et al. | 257/789 |
| 7,960,462 B2 * | 6/2011 | Shinba et al. | 524/423 |
| 8,017,290 B2 * | 9/2011 | Nakamura et al. | 430/48 |
| 8,120,189 B2 * | 2/2012 | Arifuku et al. | 257/783 |
| 8,148,829 B2 * | 4/2012 | Hu | 257/788 |
| 8,394,493 B2 * | 3/2013 | Hong et al. | 428/323 |
| 2009/0001614 A1 * | 1/2009 | Condie et al. | 257/795 |

* cited by examiner

INSULATING MEMBER, METAL BASE SUBSTRATE, AND SEMICONDUCTOR MODULE, AND MANUFACTURING METHODS THEREOF

BACKGROUND OF THE INVENTION

1. Technical Field

Embodiments of the present invention relate to an insulating member, metal base substrate, and semiconductor module, and to manufacturing methods thereof.

2. Related Art

Semiconductor modules used in power supply devices are applied over a wide range, from consumer instruments such as domestic air conditioners and refrigerators, to industrial instruments such as inverters and servo controllers. From the point of view of power consumption, a semiconductor module is mounted on a wiring substrate such as a metal base substrate or ceramic substrate. One or a plurality of circuit elements, such as a power semiconductor element, is mounted on the wiring substrate, a plastic case frame is affixed, and the semiconductor module is completed by being sealed with a silicon gel, an epoxy resin, or the like.

Also, in order to reduce manufacturing cost, a semiconductor module fully molded using a transfer molding method has been developed (see, for example, Japanese Patent Application No. JP-A-9-139461, Paragraph [0038], FIG. 1, and FIG. 18). With a fully molded semiconductor module, a lead frame and heat sink are immovably linked, and an electrical insulation thereof is ensured. FIGS. 4 to 6 show an example of a heretofore known fully molded semiconductor module 40.

In the example shown in FIG. 4, a plurality of circuit elements 46, such as power semiconductor elements or drive ICs, are mounted on a lead frame 47, and are connected to each other by a bonding wire 48. After the assembly is placed in a predetermined molding die, a fully molded semiconductor module 40a is completed by pouring a molding resin 49 into the molding die. In the example shown in FIG. 5, in addition to the configuration of the example shown in FIG. 4, a heat sink 50 is provided in a lower portion of the module. In the example shown in FIG. 6, a metal base substrate 60, formed by a metal foil 62 and a metal base 63 being affixed in advance to the front and rear surfaces of an insulating layer 61, is provided. The metal base substrate 60 combines the two functions of an insulating layer and a heat sink.

However, from the point of view of power consumption, the heretofore known fully molded semiconductor module has an application limit in the region of 200V, 50 A, and when current capacity exceeds 50 A, the power semiconductor element loss increases, and there is a problem in that the cooling property of the fully molded semiconductor module is insufficient. With a semiconductor module using a metal base substrate, it is possible to make the thickness of the insulating layer of the metal base substrate small at 100 to 150 μm, meaning that it is possible to reduce the heat resistance of the lower portion of the power semiconductor. Meanwhile, with the fully molded semiconductor module, it is necessary to make the thickness of the molding resin 300 μm or more in order to ensure the loadability of the molding resin, and the heat resistance increases.

In the example shown in FIG. 5, when making the thickness of the molding resin 49 in the lower portion of the module 200 μm or less, a space in which no molding resin 49 is loaded remains in, for example, a gap between the lead frame 47 and heat sink 50, and an insulation failure occurs. Although the loadability is improved by raising the resin injection pressure when molding, this may be a cause of a deformation or disconnection of the bonding wire 47.

In the example shown in FIG. 6, as the circuit element 46 and bonding wire 47 are joined directly to the metal base substrate 60, there is no need to load the molding resin in the lower portion of the module. However, as it is necessary to manufacture the metal base substrate 60 separately, there is a problem in that the cost of materials increases.

Also, in the insulating layer 61 of the metal base substrate 60, thermal conductivity is increased by loading an inorganic filler (for example, silicon oxide, aluminum oxide, silicon nitride, aluminum nitride, or boron nitride) into an epoxy resin, but as the breakdown voltage decreases along with an increase in the amount loaded, a thermal conductivity of 3 to 4 W/m·K is the limit, and there is a limit to the cooling property.

Although it is also possible to use a ceramic substrate, which is a sintered body of aluminum oxide, silicon nitride, aluminum nitride, or the like, for the wiring substrate in order to increase the thermal conductivity, there is a problem in that the ceramic substrate causes the cost to increase further than the metal base substrate.

SUMMARY OF THE INVENTION

Therefore, embodiments of the invention, bearing in mind the heretofore described problems, have an object of providing an insulating member superior in both heat radiation and breakdown strength, a metal base substrate and semiconductor module using the insulating member, and manufacturing methods thereof.

In order to achieve this and other objects, one aspect of the invention is an insulating member including an epoxy resin, a first inorganic filler diffused in the epoxy resin and having an average particle diameter of 1 to 99 nm, and a second inorganic filler diffused in the epoxy resin and having an average particle diameter of 0.1 to 100 μm, wherein the first and second inorganic fillers are independent of each other, and are at least one selected from a group including $Al_2O_3$, $SiO_2$, BN, AlN, and $Si_3N_4$, and the blending ratios of the first and second inorganic fillers in the insulating member are 0.1 to 7% by weight and 80 to 95% by weight respectively.

In certain embodiments, it is preferable that the average particle diameter of the first inorganic filler is 1 to 50 nm, that the average particle diameter of the second inorganic filler is 0.1 to 50 μm and that the blending ratio of the first inorganic filler is 3 to 6% by weight.

In certain embodiments, it is preferable that the thickness of the insulating member is 10 to 500 μm, and that the insulating member has a thermal conductivity of 4 to 15 W/m·K, and a breakdown voltage of at least 5 kV.

Another aspect of embodiments of the invention is a metal base substrate, including an insulating layer of the heretofore described insulating member, a metal base plate, and a metal foil.

Still another aspect of embodiments of the invention is a semiconductor module, including the heretofore described metal base substrate, and at least one circuit element mounted on the surface of the metal foil of the metal base substrate.

Another embodiment of the semiconductor module according to this aspect of the invention includes a metal block, an insulating layer of the heretofore described insulating member affixed to one surface of the metal block, and at least one circuit element mounted on the other surface of the metal block.

Another aspect of embodiments of the invention is an insulating member manufacturing method, including steps of adding a first inorganic filler having an average particle diameter of 1 to 99 nm to an epoxy resin, pressurizing a mixture of the first inorganic filler and the epoxy resin, causing it to pass through an orifice, and preventing an agglomeration of the first inorganic filler, further adding a second inorganic filler having an average particle diameter of 0.1 to 100 μm to the mixture caused to pass through the orifice, and forming and hardening the mixture of the first and second inorganic fillers and the epoxy resin.

Still another aspect of the invention is a semiconductor module manufacturing method, including steps of affixing the heretofore described insulating member as an insulating layer to one surface of a metal block, and mounting at least one circuit element on the other surface of the metal block.

As heretofore described, according to embodiments of the invention, by using two kinds of inorganic filler like this with differing average particle diameters in predetermined blending ratios, it is possible to increase breakdown strength while maintaining the heat radiation of the insulating member. Then, by using the insulating member in a metal base substrate or semiconductor module as heretofore described, it is possible to provide a metal base substrate and semiconductor module superior in heat radiation.

DETAILED DESCRIPTION OF THE EMBODIMENTS

Figure 1:
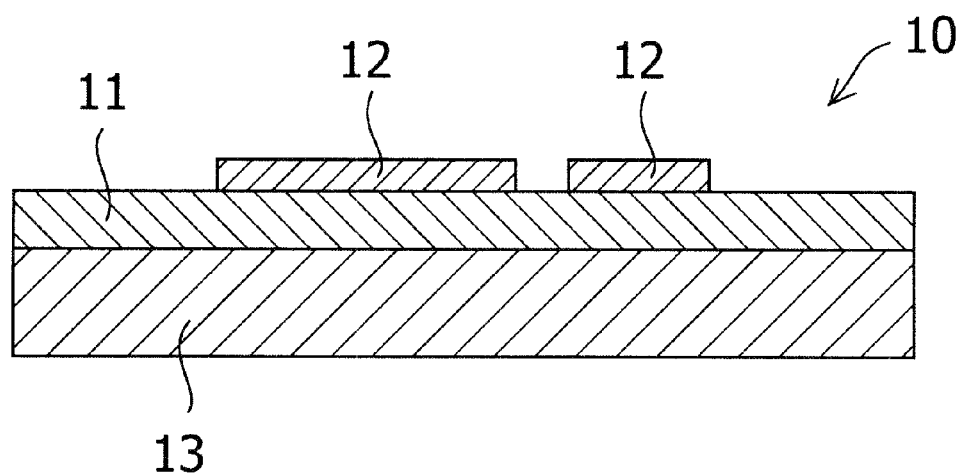
FIG. 1 is a sectional view schematically showing one embodiment of a metal base substrate according to the invention.

Hereafter, referring to the attached drawings, a description will be given of one embodiment of the invention. The embodiment described hereafter is intended to describe the invention in detail, and does not limit the invention. In addition, one or more of the features described herein can be implemented in different embodiments of the invention.

Firstly, a description will be given of one embodiment of an insulating member according to the invention. The insulating member includes an epoxy resin, and a first inorganic filler with an average particle diameter of 1 to 99 nm and second inorganic filler with an average particle diameter of 0.1 to 100 μm dispersed in the epoxy resin.

Although the invention is not so limited, for example, a bifunctional epoxy resin such as a bisphenol A epoxy resin or bisphenol F epoxy resin, or a multifunctional epoxy resin such as a phenol novolac epoxy resin, cresol novolac epoxy resin, bisphenol A novolac epoxy resin, bisphenol F novolac epoxy resin, naphthalene epoxy resin, biphenyl epoxy resin, or dicyclopentadiene epoxy resin, can be used, singly or in a combination of a plurality thereof, as the epoxy resin. Among these, an aromatic epoxy resin is preferable, and the bisphenol A epoxy resin is particularly preferable for use.

The average particle diameter of the first inorganic filler can be extremely small, being in the range of 1 to 99 nm. When the diameter is less than 1 nm, there can be a problem in that agglomeration occurs. Meanwhile, when the diameter is 100 nm or more, there can be a problem in that the benefit particular to a nanofiller cannot be obtained. The average particle diameter of the second inorganic filler is comparatively large, being in the range of 0.1 to 100 μm. When the diameter exceeds 100 μm, there is a problem in that the insulation property cannot be obtained. Meanwhile, when the diameter is less than 0.1 μm, there is a problem in that kneading becomes difficult.

In some embodiments, it is more preferable that the average particle diameter of the first inorganic filler is in a range of 1 to 50 nm. Also, it is more preferable that the average particle diameter of the second inorganic filler is 0.1 to 50 μm. In this specification, the measurement of the average particle diameter is carried out using a laser diffraction and scattering method. Also, in some embodiments, it is preferable that the particle diameter distribution of the first inorganic filler is in a range of 1 to 99 nm, and more preferable that it is in a range of 1 to 50 nm. In some embodiments, it is preferable that the particle size distribution of the second inorganic filler is in a range of 0.1 to 100 μm, and more preferable that it is in a range of 0.5 to 50 μm.

The first inorganic filler is one, or a combination of a plurality, selected from a group including $Al_2O_3$, $SiO_2$, BN, AlN, and $Si_3N_4$. Also, the second inorganic filler is also one, or a combination of a plurality, selected from a group including $Al_2O_3$, $SiO_2$, BN, AlN, and $Si_3N_4$. The first inorganic filler and second inorganic filler may be the same compound, or may be differing compounds.

The blending ratio of the first inorganic filler is in a range of 0.1 to 7% by weight, with the weight of the insulating member as 100%. When the blending ratio is less than 0.1% by weight, there is a problem in that the benefit of the nanofiller cannot be obtained. Meanwhile, when the blending ratio exceeds 7% by weight, there is a problem in that diffusion is not possible. It is more preferable that the blending ratio of the first inorganic filler is in a range of 3 to 6% by weight.

The blending ratio of the second inorganic filler is in a range of 80 to 95% by weight, with the weight of the insulating member as 100%. When the blending ratio is less than 80% by weight, there is a problem in that a predetermined thermal conductivity cannot be obtained. Meanwhile, when the blending ratio exceeds 95% by weight, there is a problem in that the insulation property decreases. It is more preferable that the blending ratio of the second inorganic filler is in a range of 80 to 90% by weight.

A hardening agent or hardening aid may be added to the insulating member of the invention in order to control a hardening reaction. As the hardening agent may be one commonly used as an epoxy resin hardening agent, for example, a guanidine series hardening agent such as dicyandiamide, a dihydrazide series hardening agent such as adipic acid dihydrazide, isophthalic acid dihydrazide, or dodecanoic acid dihydrazide, a phenol series hardening agent such as phenol novolac, an acid anhydride series hardening agent such as a methyltetrahydrophthalic acid anhydride, an amine series hardening agent such as diaminodiphenylmethane, or an imidazole series hardening agent such as 2-ethyl-4-methyl imidazole, can be used. Also, an imidazole type such as 2-ethyl-4-methyl imidazole, a tertiary amine type such as benzylmethylamine, a fragrant phosphine type such as triphenylphosphine, or a Lewis acid such as boron trifluoride monoethylamine, can be used as the hardening aid.

It is preferable that the blending ratio of the hardening agent is 1 to 10% by weight, with the insulating member as 100% by weight. Also, it is preferable that the blending ratio of the hardening aid is 0.1 to 5% by weight, with the insulating member as 100% by weight. The blending ratio of each raw material of the insulating member has been heretofore described, and the remainder is the blending ratio of the epoxy resin.

Next, a description will be given of a manufacturing method of the insulating member. Firstly, the first inorganic filler is added to the epoxy resin. As the particle diameter of the first inorganic filler is extremely small, the particles agglomerate even when stirred, and it is extremely difficult to cause the first inorganic filler to diffuse in the resin. Therefore, after adding the first inorganic filler to the epoxy resin, it is possible to cause the first inorganic filler to diffuse in the epoxy resin by pressurizing the mixture and causing it to pass through an orifice, using a pressurized orifice passage type diffuser.

Next, the second inorganic filler is added to the mixture. As the particle diameter of the second inorganic filler is comparatively large, it is possible to cause the second inorganic filler to diffuse in the epoxy resin, without agglomerating, simply by stirring. The epoxy resin may be further added along with the addition of the second inorganic filler. That is, a predetermined blending ratio of the epoxy resin may be added on two separate occasions.

After adding the second inorganic filler, the hardening agent and hardening aid are added as necessary, and stirred. Also, when pre-impregnating the mixture, a solvent may also be added at the same time. It is possible to use, for example, methyl ethyl ketone (MEK) as the solvent.

Next, the mixture is formed into a predetermined form, such as a sheet. For example, after the mixture is applied to the surface of a metal plate or plastic plate which can be demolded, it is pressurized to a predetermined thickness using a spacer, and hardened by heating. In this way, it is possible to manufacture the insulating member. It is preferable that the thickness of the sheet-form insulating member is in a range of 10 to 500 µm, and more preferable that it is in a range of 70 to 300 µm. The insulating member obtained in this way has a thermal conductivity of 4 to 15 W/m·K and a breakdown voltage of at least 5 kV, and is superior in both heat radiation and breakdown strength.

Referring to FIG. 1, a description will be given of an embodiment of a metal base substrate using the insulating member according to the invention, and of a manufacturing method of the metal base substrate. As shown in FIG. 1, a metal base substrate 10 includes an insulating layer 11 of the insulating member according to the invention, one or a plurality of metal foils 12 formed on one surface of the insulating layer 11, and a metal base 13 formed on the other surface of the insulating layer 11.

For example, Cu or Al can be used for the metal foil 12. After forming the metal foil 12 on the surface of the insulating layer 11, a circuit pattern can be formed by patterning by way of a selective etching. For example, Cu, Al, or Fe can be used for the metal base 13. The metal base 13 can be affixed by placing it against the surface of the insulating layer 11, and applying a hot press.

By adopting this kind of metal base substrate 10, it is possible to adopt any form for a wiring substrate, and it is also possible to configure the circuit pattern as desired. Therefore, a circuit element such as a power semiconductor element can be applied to any kind of semiconductor module, simply by being mounted on the metal foil 12.

Figure 2:
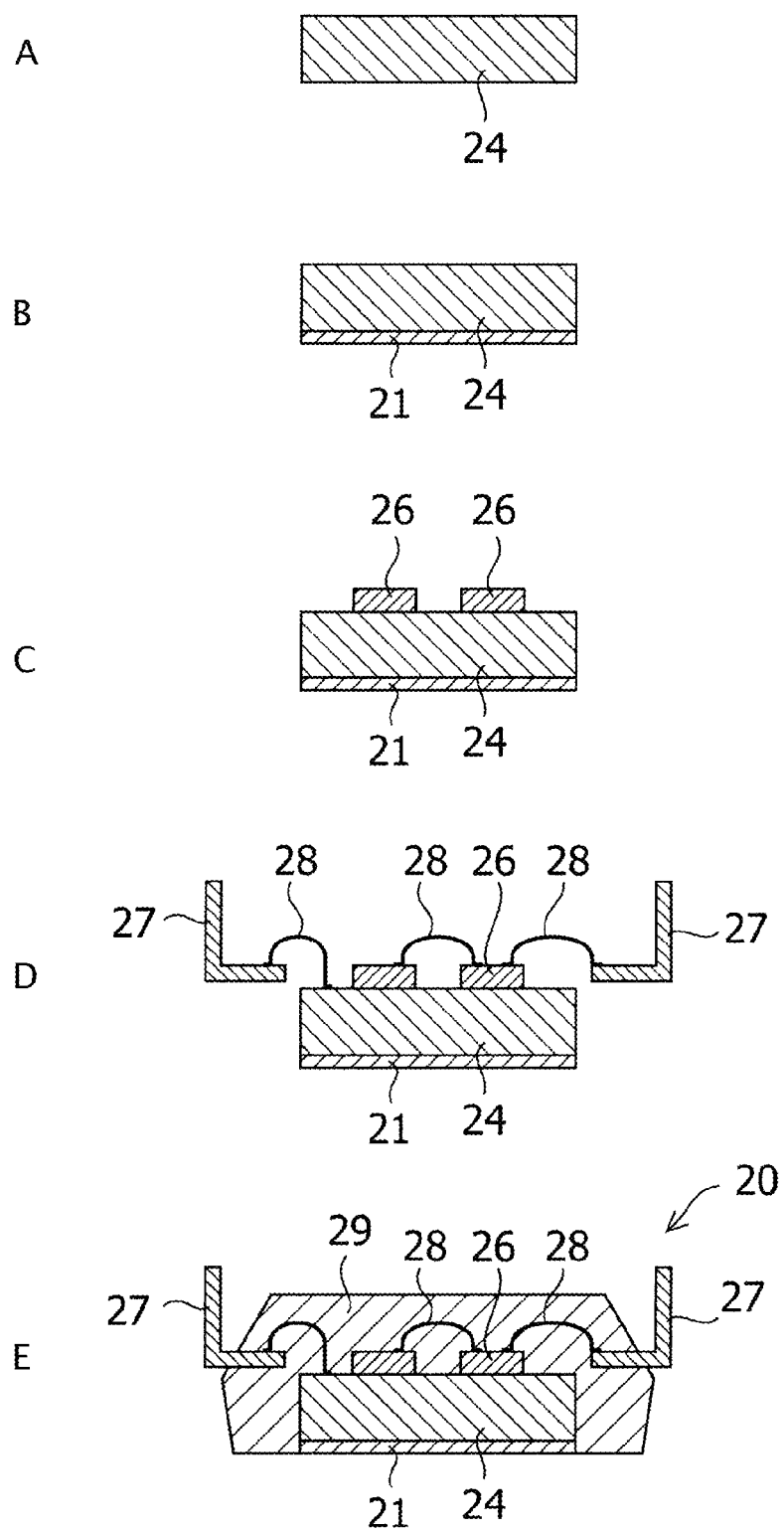
FIGS. 2A to 2E are sectional views schematically showing one embodiment of a semiconductor module manufacturing method according to the invention.

Referring to FIGS. 2A to 2E, a description will be given of an embodiment of a semiconductor module using the insulating member according to the invention, and of a manufacturing method of the semiconductor module. Firstly, as shown in FIG. 2A, a metal plate is punched out into a predetermined form such as a square or rectangle by pressing, thus fabricating a metal block 24. For example, Cu or Mo can be used for the metal block 24. Also, although not particularly limited, it is preferable that the thickness of the metal block 24 is in a range of 1.0 to 6.0 mm.

Next, as shown in FIG. 2B, an insulating layer 21 formed from the insulating member according to the invention is placed against one surface of the metal block 24, and the two are affixed to each other by a hot press. Also, as shown in FIG. 2C, a circuit element 26 such as a power semiconductor element or drive IC is joined by soldering to the other surface of the metal block 24. It is preferable that the soldering is carried out in a furnace in which hydrogen reduction is possible, utilizing a pellet-form solder. A reason for using a furnace in which hydrogen reduction is possible is to improve leakage by removing the solder by removing and activating an oxide film on the surface of the metal block 24 by hydrogen reduction. For example, a high temperature solder such as SnPbAg, or a lead free solder such as SnAgCu, is used as a solder material. The soldering temperature is set in accordance with the solder melting point.

When a void remains in a solder layer (not shown) of the power semiconductor element and metal block, heat resistance increases, and it is not possible to efficiently release heat generating from the power semiconductor element. Therefore, in order that no void occurs, it is preferable that vacuuming is carried out at 10 Torr or less in a condition in which the solder is melted.

Next, as shown in FIG. 2D, a connection of the circuit element 26 and a lead frame 27 is carried out using a bonding wire 28. It is preferable to use an Al wire with a diameter of 125 to 500 µm as the bonding wire 28. It is preferable that the bonding wire 28 is ultrasonically joined.

Then, as shown in FIG. 2E, the assembly is sealed with a molding resin 29 using a transfer molding method. To give a specific description of the sealing, although not particularly shown, the assembly is placed in, for example, a molding die attached to a transfer molding machine and, after pouring a tablet-form molding resin into the pre-heated molding die using a plunger, and removing it from the molding die immediately as it hardens within a few tens of seconds, the sealing is completed by post-hardening in a thermostatic chamber. It is preferable that the molding die is kept at a temperature of 170 to 180° C. The molding resin 29 includes an epoxy resin and at least one filler selected from a group including $Al_2O_3$, $SiO_2$, BN, AlN, and $Si_3N_4$. It is preferable that the molding resin 29 has a thermal conductivity of 0.5 to 5 W/m·K.

Figure 3:
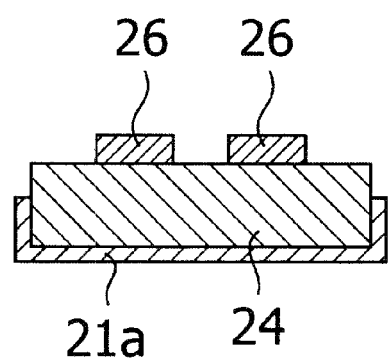
FIG. 3 is a sectional view schematically showing one alternative example of the manufacturing method shown in FIGS. 2A to 2E.
Figure 4:
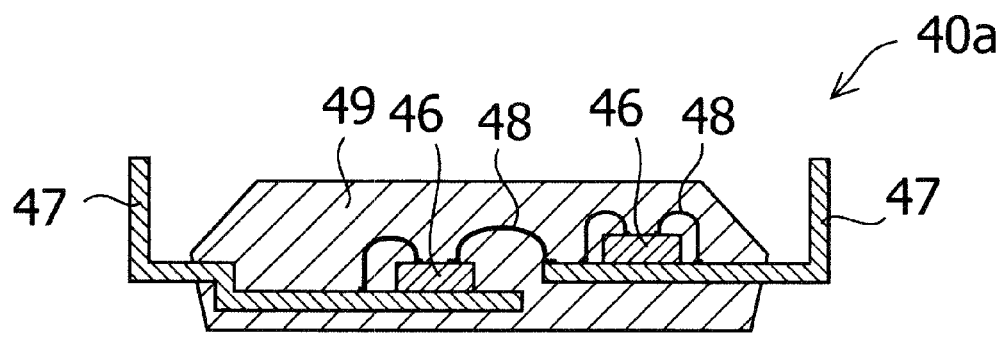
FIG. 4 is a sectional view schematically showing one example of a heretofore known semiconductor module.
Figure 5:
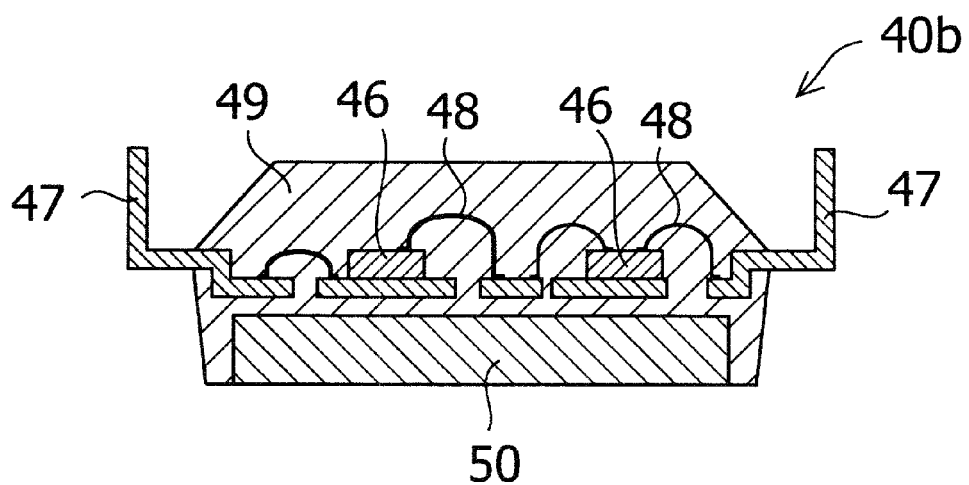
FIG. 5 is a sectional view schematically showing another example of a heretofore known semiconductor module.
Figure 6:
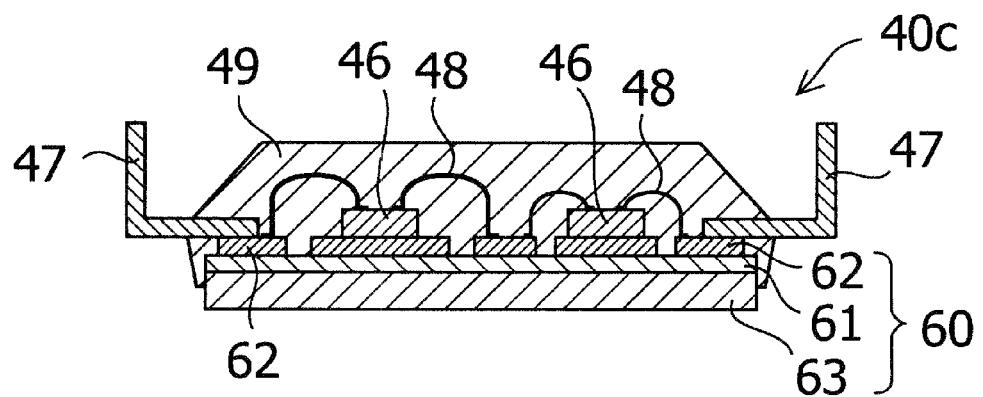
FIG. 6 is a sectional view schematically showing still another example of a heretofore known semiconductor module

In FIG. 2C, the insulating layer 21 is formed on only the surface of the metal block 24 on the side opposite to the circuit element, but it is preferable to deposit an insulating layer 21a on the side surfaces of the metal block 24 too, as shown in FIG. 3. As the insulating layer 21a is thin, it is effective when a high voltage is applied between the metal block 24 and a cooling fin (omitted from the drawing) with which a sprayed film comes into contact, and because of this it is possible to ensure the insulation property. The depositing distance of the insulating film 21a on the side surfaces of the metal block 24 is determined in accordance with the voltage used.

WORKING EXAMPLE

About 5% by weight of a nanoscale aluminum oxide (made by Taimei Chemicals Co., Ltd., model number TM-100, average particle diameter 12 nm) is added to 100% by weight of an epoxy resin (made by JER Co., Ltd., model number 828) and, after diffusing while preventing agglomeration by using an pressurized orifice passage type diffuser, 1250% by weight of a microscale aluminum oxide (made by Admatechs Co., Ltd., average particle diameter 0.6 to 10 μm) is added and stirred. Subsequently, 5% by weight of a dicyandiamide hardening agent (made by JER Co., Ltd., model number DICY15) and 2% by weight of an imidazole hardening aid (made by Shikoku Chemicals Corporation, model number 2P4MHZ) are added. Next, a sheet-form insulating member is fabricated to a thickness of 200 μm by applying the mixture onto a plate which can be demolded, and pressurizing at 5 MPa, 180° C. (Working Example 1). Then, the thermal conductivity and breakdown voltage of the insulating member are measured. The measurement of the thermal conductivity is carried out using a laser flash method. For the purposes of comparison, measurement is also carried out on an insulating member (Comparison Example 1) fabricated in the same way, excepting for the point that the microscale aluminum oxide is made 92% by weight, without adding the nanoscale aluminum oxide. The results are shown in Table 1.

TABLE 1

| | Blending Ratio (% by weight with respect to resin 100% by weight) | | | | Break- |
|---|---|---|---|---|---|
| | Micro-scale $Al_2O_3$ | Nano-scale $Al_2O_3$ | Harden-ing Agent | Harden-ing Aid | Thermal Conductivity W/m·K | down Voltage kV |
| Working Example 1 | 1,250 | 5 | 5 | 2 | 8 | 6 |
| Comparison Example 1 | 1,150 | | 5 | 2 | 8 | 4 |

As shown in Table 1, both Working Example 1 and Comparison Example 1 have a thermal conductivity of 8.0 W/m·K, but the breakdown voltage in Working Example 1 is 6.0 kV, showing a value 1.5 times higher than the 4.0 kV of Comparison Example 1. In this way, as opposed to the normal condition wherein, although the thermal conductivity increases the more inorganic filler is loaded, the breakdown voltage decreases, it is possible to prevent the breakdown voltage from decreasing by adding a nanoscale inorganic filler, as in Working Example 1. Of course, embodiments of the invention can be formed with other materials and amounts than set forth in the above-described working example.

This application is based on, and claims priority to, Japanese Patent Application No. 2010-138136, filed on Jun. 17, 2010. The disclosure of the priority application, in its entirety, including the drawings, claims, and the specification thereof, is incorporated herein by reference.

What is claimed is:

1. An insulating member, comprising:
    an epoxy resin;
    a first inorganic filler diffused in the epoxy resin and having an average particle diameter of 1 to 99 nm; and
    a second inorganic filler diffused in the epoxy resin and having an average particle diameter of 0.1 to 100 μm, wherein
    the first and second inorganic fillers are independent of each other, and are at least one selected from a group including $Al_2O_3$, $SiO_2$, BN, AlN, and $Si_3N_4$, and
    the blending ratios of the first and second inorganic fillers in the insulating member are 0.1 to 7% by weight and 80 to 95% by weight, respectively.

2. The insulating member according to claim 1, wherein the average particle diameter of the first inorganic filler is 1 to 50 nm.

3. The insulating member according to claim 1, wherein the average particle diameter of the second inorganic filler is 0.1 to 50 μm.

4. The insulating member according to claim 1, wherein the thickness of the insulating member is 10 to 500 μm.

5. The insulating member according to claim 1, wherein the blending ratio of the first inorganic filler is 3 to 6% by weight.

6. The insulating member according to claim 1, wherein the insulating member has a thermal conductivity of 4 to 20 W/m·K, and a breakdown voltage of at least 5 kV.

7. A metal base substrate, comprising:
    an insulating layer of the insulating member according to claim 1;
    a metal base plate; and
    a metal foil.

8. A semiconductor module, comprising:
    the metal base substrate according to claim 7; and
    at least one circuit element mounted on the surface of the metal foil of the metal base substrate.

9. A semiconductor module, comprising:
    a metal block;
    an insulating layer of the insulating member according to claim 1 affixed to one surface of the metal block; and
    at least one circuit element mounted on the other surface of the metal block.

10. A semiconductor module manufacturing method, comprising steps of:
    affixing the insulating member according to claim 1 as an insulating layer to one surface of a metal block; and
    mounting at least one circuit element on the other surface of the metal block.

11. An insulating member manufacturing method, comprising steps of:
    adding a first inorganic filler having an average particle diameter of 1 to 99 nm to an epoxy resin;
    pressurizing a mixture of the first inorganic filler and the epoxy resin, causing it to pass through an orifice, and preventing an agglomeration of the first inorganic filler;
    further adding a second inorganic filler having an average particle diameter of 0.1 to 100 μm to the mixture caused to pass through the orifice; and
    forming and hardening the mixture of the first and second inorganic fillers and the epoxy resin.

12. The method according to claim 11, wherein
    the first and second inorganic fillers are independent of each other, and are at least one selected from a group including $Al_2O_3$, $SiO_2$, BN, AlN, and $Si_3N_4$, and
    the blending ratios of the first and second inorganic fillers in the insulating member are 0.1 to 7% by weight and 80 to 95% by weight respectively.

* * * * *